United States Patent
Sun et al.

(10) Patent No.: US 10,025,003 B1
(45) Date of Patent: Jul. 17, 2018

(54) CALIBRATION METHOD UNDER NEAR-BIT WIRELESS SHORT-TRANSMISSION GROUND ENVRIONMENT BASED ON ELECTRIC FIELD THEORY

(71) Applicant: Institute of Geology and Geophysics, Chinese Academy of Sciences, Beijing (CN)

(72) Inventors: Yuntao Sun, Beijing (CN); Wenxuan Chen, Beijing (CN); Wenxiu Zhang, Beijing (CN); Yongyou Yang, Beijing (CN); Qingyun Di, Beijing (CN); Jian Zheng, Beijing (CN)

(73) Assignee: INSTITUTE OF GEOLOGY AND GEOPHYSICS, CHINESE ACADEMY OF SCIENCES, Beijing (CN)

(*) Notice: Subject to any disclaimer, the term of this patent is extended or adjusted under 35 U.S.C. 154(b) by 0 days.

(21) Appl. No.: 15/708,951

(22) Filed: Sep. 19, 2017

(30) Foreign Application Priority Data

Jan. 19, 2017 (CN) .......................... 2017 1 0044241

(51) Int. Cl.
| | |
|---|---|
| G01V 13/00 | (2006.01) |
| G01V 11/00 | (2006.01) |
| G01V 3/30 | (2006.01) |
| G01V 3/26 | (2006.01) |
| G01R 29/08 | (2006.01) |
| G01R 19/04 | (2006.01) |
| E21B 47/12 | (2012.01) |
| E21B 47/18 | (2012.01) |

(52) U.S. Cl.
CPC ............ *G01V 13/00* (2013.01); *E21B 47/122* (2013.01); *G01R 19/04* (2013.01); *G01R 29/0814* (2013.01)

(58) Field of Classification Search
CPC .. G01V 13/00; E21B 47/122; G01R 29/0814; G01R 19/04
USPC ............ 73/152.46, 152.18; 340/853.1–856.4
See application file for complete search history.

(56) References Cited

U.S. PATENT DOCUMENTS

| | | | |
|---|---|---|---|
| 7,096,313 | B1 | 8/2006 | Chang et al. |
| 7,762,854 | B1 | 7/2010 | Peng |
| 2001/0012703 | A1 | 8/2001 | Wurm et al. |

(Continued)

FOREIGN PATENT DOCUMENTS

| | | |
|---|---|---|
| CN | 1740746 A | 3/2006 |
| CN | 2849164 Y | 12/2006 |

(Continued)

*Primary Examiner* — Daniel S Larkin
*Assistant Examiner* — Anthony W Megna Fuentes
(74) *Attorney, Agent, or Firm* — Novick, Kim & Lee, PLLC; Allen Xue

(57) ABSTRACT

A calibration method under a near-bit wireless short-transmission ground environment includes the following steps: placing an emitter and a receiver, which are connected across a screw, in a container containing a solution, connecting the emitter with the receiver through a copper wire to form a loop of an electric field signal, connecting the emitter with a transmitting circuit to achieve signal transmission, connecting the receiver with a receiving circuit to achieve signal reception, and calibrating an optimal transmitting power and a receiving gain by measuring an amplitude relationship between a transmitted signal and a received signal in a case where resistivity values of solutions are different.

9 Claims, 5 Drawing Sheets

(56) References Cited

U.S. PATENT DOCUMENTS

| | | | |
|---|---|---|---|
| 2002/0075114 | A1 | 6/2002 | Hall et al. |
| 2007/0247329 | A1* | 10/2007 | Petrovic ............... G01V 11/002 340/854.4 |
| 2009/0023502 | A1 | 1/2009 | Koger |
| 2009/0153355 | A1* | 6/2009 | Price .................... E21B 17/028 340/854.6 |
| 2012/0249338 | A1* | 10/2012 | Merino ................. H04B 11/00 340/854.6 |
| 2012/0299743 | A1 | 11/2012 | Price et al. |
| 2014/0332235 | A1 | 11/2014 | Mueller et al. |
| 2016/0017706 | A1* | 1/2016 | Liu ..................... H04W 52/367 340/853.2 |
| 2016/0109608 | A1* | 4/2016 | Branson .................. G01V 3/10 324/329 |
| 2016/0187525 | A1* | 6/2016 | Wilson .................... G01V 3/30 702/6 |

FOREIGN PATENT DOCUMENTS

| | | |
|---|---|---|
| CN | 101289935 A | 10/2008 |
| CN | 201221354 Y | 4/2009 |
| CN | 101493008 A | 7/2009 |
| CN | 102418516 A | 4/2012 |
| CN | 202187758 U | 4/2012 |
| CN | 103061755 A | 4/2013 |
| CN | 103577121 A | 2/2014 |
| CN | 204283400 U | 4/2015 |
| CN | 204283413 U | 4/2015 |
| CN | 105353357 A | 2/2016 |
| CN | 105760113 A | 7/2016 |
| CN | 105804722 A | 7/2016 |
| CN | 206299372 U | 7/2017 |
| CN | 206299375 U | 7/2017 |

* cited by examiner

CALIBRATION METHOD UNDER NEAR-BIT WIRELESS SHORT-TRANSMISSION GROUND ENVRIONMENT BASED ON ELECTRIC FIELD THEORY

TECHNICAL FIELD

The present invention mainly belongs to the field of measurement while drilling, and particularly to a calibration method under a near-bit wireless short-transmission ground environment.

BACKGROUND

In logging while drilling and drilling operations, near-bit measurement can obtain position information of a drill bit in real time, thereby characterizing real-time drilling trajectory information, so that a ground operating engineer can adjust a drilling speed and a drilling direction in real time and complete a drilling operation according to the set borehole trajectory. A sensor of the near-bit measurement is installed between the drill bit and a mud motor. Due to a special structure (which is completely a mechanical mechanism without electrical connections such as stringing, unless a structure of the screw is modified) of the mud motor, a near-bit measurement unit is not electrically connected with a MWD system. Accordingly, measured data of a near-bit measurement stub may be transmitted to the MWD system above the mud motor in real time only through a wireless manner, and then transmitted to the ground through a mud pulse telemetry system.

The wireless short-transmission system uses an electric field formed by the emitter and the receiver to realize a wireless short-transmission function. An insulator is inserted between a positive pole and a negative pole of the emitter to achieve electrical isolation between the two parts of the emitter. The receiver is installed at about 10 meters from the emitter on the other side of the mud motor, and an insulator is also inserted between a positive pole and a negative pole of the receiver to achieve electrical isolation between the two parts of the receiver. After an electrical signal emitted by the positive pole of the emitter passes through a stratum and a wellbore mud channel, a potential difference exists between the positive pole and the negative pole of the receiver, and then returned to the negative pole of the emitter through a loop formed by the mud motor. Due to a difference in resistivity values of a stratum environment and mud, the dynamic range of the potential difference formed between the positive pole and the negative pole of the receiver is very large. In a research and development process, there is a need for calibrating a transmitting power and a receiving gain for a case of resistivity values of different drilling strata in combination with the environment. However, wireless short transmission achieves wireless signal transmission by means of a closed-loop electric field under a wellbore mud environment. Since the wellbore environment at a well site is tough, an experimental operation in the actual well site is inconvenient, time-consuming and costly so that research and development costs are high, resulting in incapability of realizing testing of the system under different drilling environments and great difficulty in research and development.

SUMMARY

In view of the above problems, the present invention simulates an actual wellbore environment in the ground, calibrates a transmitting power and a receiving gain in a case of resistivity values (within a stratum resistivity range of 0.2 ohm-meter to 200 ohm-meter) of different drilling strata, perfects a modulation method and a demodulation method, and improves the reliability and the stability of a wireless short-transmission system.

In one embodiment of the current disclosure, a calibration method under a near-bit wireless short-transmission system based on an electric field theory is used to calibrate a near-bit wireless short-transmission system based on the electric field theory. The system includes an emitter and a receiver. The emitter and the receiver are connected to the mud motor. The calibration method includes the following steps: placing the emitter and the receiver, which are connected to the mud motor, in a container containing a solution. connecting the emitter with the receiver using a metal wire to form a loop of an electric field signal; connecting the emitter with a transmitting circuit to achieve signal transmission; connecting the receiver with a receiving circuit to achieve signal reception; and calibrating an optimal transmitting power and a receiving gain by measuring an amplitude relationship between a transmitted signal and a received signal in a case where resistivity values of solutions are different.

The emitter and the receiver are immersed in the solution. The resistivity value of the solution may be adjusted. Further, the resistivity value of the solution can be adjusted within 0.2 ohm-meter to 200 ohm-meter.

Further, the metal wire is a copper wire. Further, the container is made of an insulation material, which prevents the electric field signal from propagating through the wall of the container. In addition, the emitter includes a transmitting positive pole and a transmitting negative pole, and the receiver includes a receiving positive pole and a receiving negative pole. An insulator is inserted between the transmitting positive pole and the transmitting negative pole to achieve electrical isolation between two parts of the emitter. An insulator is inserted between the receiving positive pole and the receiving negative pole, to achieve electrical isolation between two parts of the receiver.

The transmitting positive pole and the transmitting negative pole are respectively connected with the transmitting circuit through a lead 1 and a lead 2; the receiving positive pole and the receiving negative pole are respectively connected with the receiving circuit through a lead 3 and a lead 4, and the receiving circuit measures a potential difference between the lead 3 and the lead 4 to achieve signal reception.

Further, the length of the lead is less than 10 cm, thereby ensuring that a resistance from the transmitting circuit to the emitter and a resistance from the receiver to the receiving circuit are small. Further, the solution is an aqueous sodium chloride solution, and the resistivity of the solution is adjusted by adjusting a concentration of sodium chloride.

Further, a diameter of the copper wire is 1 cm or more, and the length of the copper wire is not greater than that of the mud motor, thereby ensuring that a resistance of the loop of the signal is small. Further, the container is made of PVC or glass.

The present invention has advantageous effects as follows:

The calibration method under a near-bit wireless short-transmission ground testing environment of the present invention can completely replace the calibration under a well site environment, can achieve research and development and test works of a near-bit wireless short-transmission system based on the electric field theory in a laboratory, is simple in building an environment, has a simulated wireless channel, brings the convenience to modify a resistivity environment, may traverse wellbore environments of all

DETAILED DESCRIPTION

Objectives, technical solutions and advantages of the present invention will become more apparent from the following detailed description of the present invention when taken in conjunction with accompanying drawings. It should be understood that specific embodiments described herein are merely illustrative of the present invention and are not intended to limit the present invention.

Rather, the present invention encompasses any alternatives, modifications, equivalents, and solutions made within the spirit and scope of the present invention as defined by the claims. Further, in order to give the public a better understanding of the present invention, some specific details are described below in detail in the following detailed description of the present invention. It will be appreciated by those skilled in the art that the present invention may be understood without reference to the details.

Example 1

Figure 1:
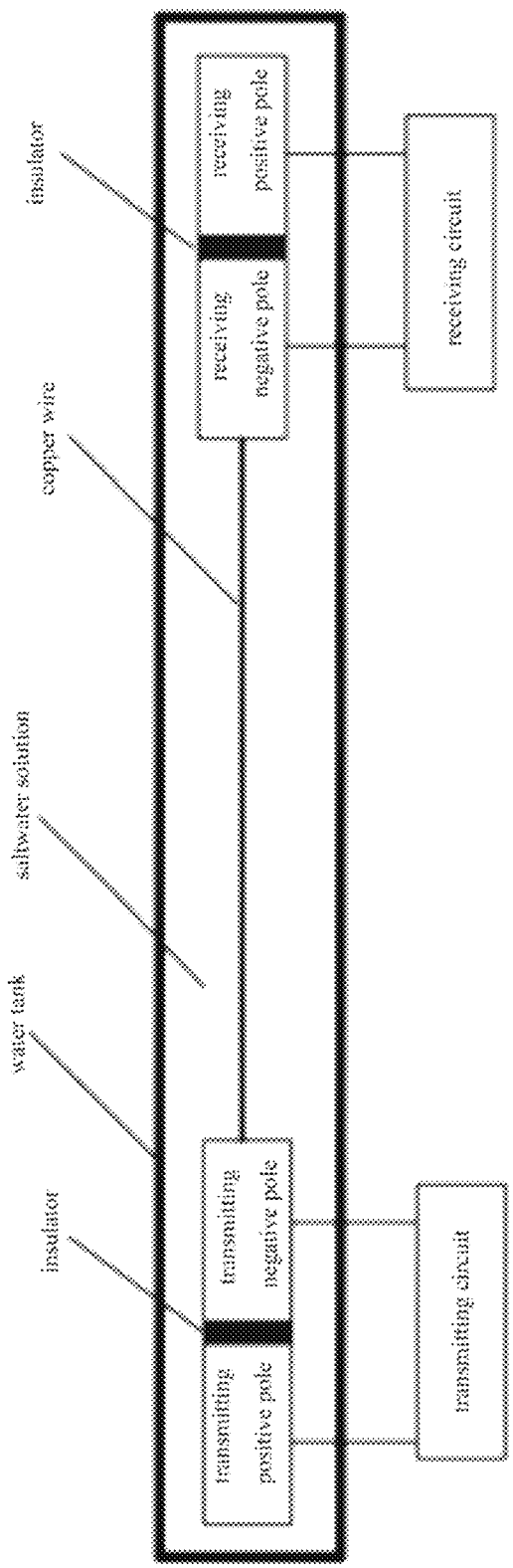
FIG. 1 is a schematic diagram of a ground environment apparatus constructed according to a calibration method of the present invention.

Example 1 illustrates a calibration method under a near-bit wireless short-transmission ground environment based on an electric field theory. A system constructing structure under a ground environment is as shown in FIG. 1. An emitter and a receiver of the whole system are placed in a water tank, and the water tank is 10 meters in length (which is identical to that of the mud motor to which the emitter and the receiver are connected), 40 cm in width, and 40 cm in height. The water tank is filled with a saltwater solution which accounts for ⅔ of a capacity of the water tank. A concentration of the saltwater solution can be determined by the quality of sodium chloride crystals added, so as to adjust a resistivity value of the saltwater solution. The water tank must be made of an insulating material, PVC or glass material, so that an electric field signal can be prevented from propagating through a wall of the water tank. The emitter and the receiver are completely immersed in the saltwater solution, are composed of a positive pole portion, a negative pole portion and an insulator, and are of a cylinder with a diameter of 20 cm to 30 cm as a whole, and a transmitting negative pole is connected with a receiving negative pole through a long copper wire to form a path for an electric field signal. A diameter of the copper wire is required to be more than 1 cm so as to ensure that a resistance of the loop of the signal is small.

The positive pole and the negative pole of the emitter are connected with a transmitting circuit via two short and thick leads. A resistance of the positive pole portion and the negative pole portion from the transmitting circuit to the emitter is measured to be less than 0.1 ohms. A positive pole and a negative pole of the receiver must also be connected to a receiving circuit via two short and thick leads. The receiving circuit measures a potential difference between the two leads, thereby realizing signal reception. American Standard 24 gauge leads are selected as the leads, the lengths of which are less than 10 cm.

Figure 2:
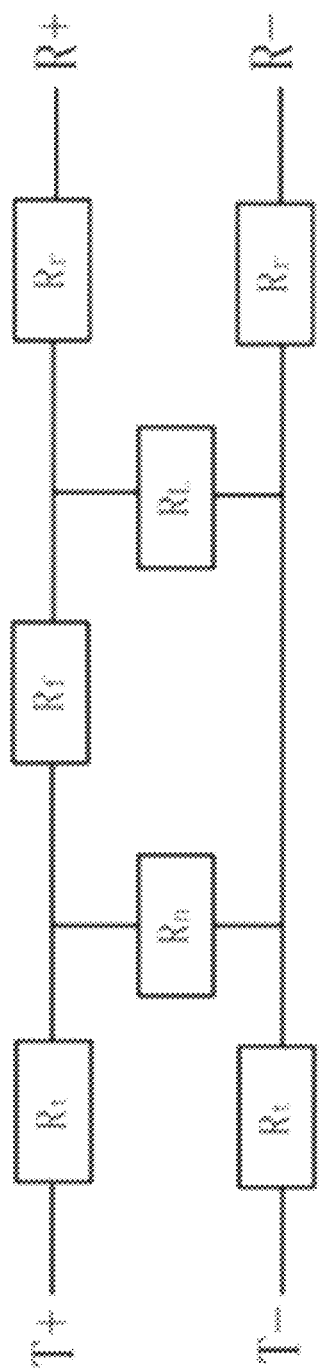
FIG. 2 is a schematic diagram of a ground environment circuit constructed according to a calibration method of the present invention.

An equivalent circuit of a ground calibration environment is as shown in FIG. 2. Rt and Rr are resistances introduced by externally connecting the leads. Their value should be less than 0.1 ohms in practice, which is negligible. Rn is a resistance of a near-end loop of an electric field of the transmitting circuit, and its resistance value is in direct proportional to the resistivity value of the saltwater solution in the water tank. Rf is a resistance of a far-end loop of the electric field of the transmitting circuit, and its resistance is in direct proportional to the resistivity value of the saltwater solution in the water tank. Also, Rf is much larger than Rn. Meanwhile, as the resistivity value of the saltwater solution in the water tank decreases, a Rf/Rn ratio decreases exponentially, causing most of energy of the electric field of the transmitting circuit to pass through the Rn near-end loop and only a small amount of energy to pass through the Rf far-end Loop.

The above method is used to perform calibration in a case where resistivity values of solutions are different.

Figure 3:
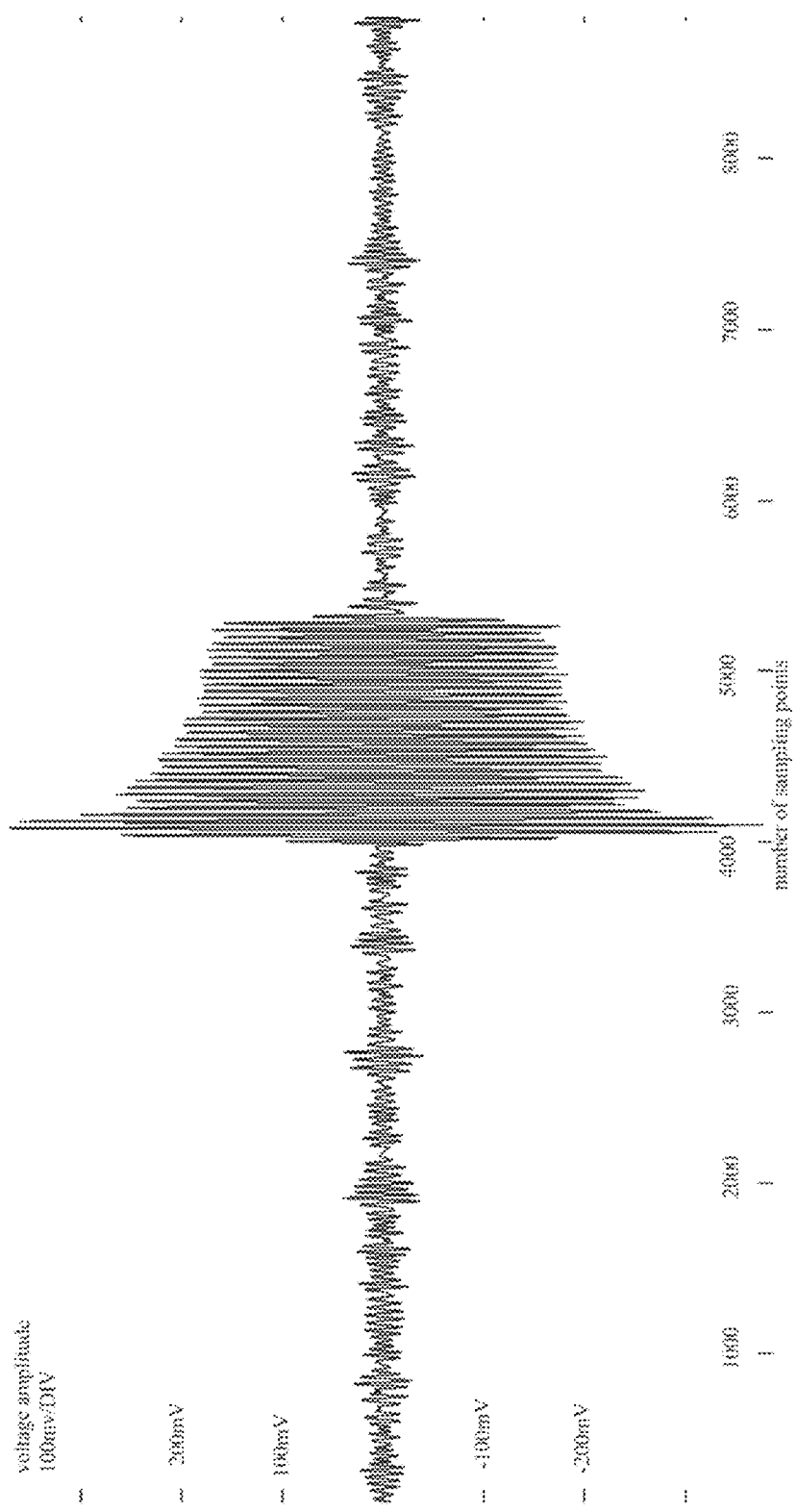
FIG. 3 is a schematic diagram of receiving a signal when a resistivity value of a solution is 1.61 ohm-meter.

The resistivity value of the saltwater solution in the water tank is 1.61 ohm-meter, a transmitted signal is a 1 KHz sinusoidal signal with 32 cycles and an amplitude 2V, and after a signal is transmitted through the emitter of the water tank, a signal obtained after a weak signal of the receiver is amplified by 100,000 times and filtered is as shown in FIG. 3. By means of this ground testing environment, it is possible to verify an amplitude relationship between the transmitted signal and the received signal in a case where the resistivity value of the stratum is 1.6 ohm-meter so as to determine an optimal transmitting power and a receiving gain.

Figure 4:
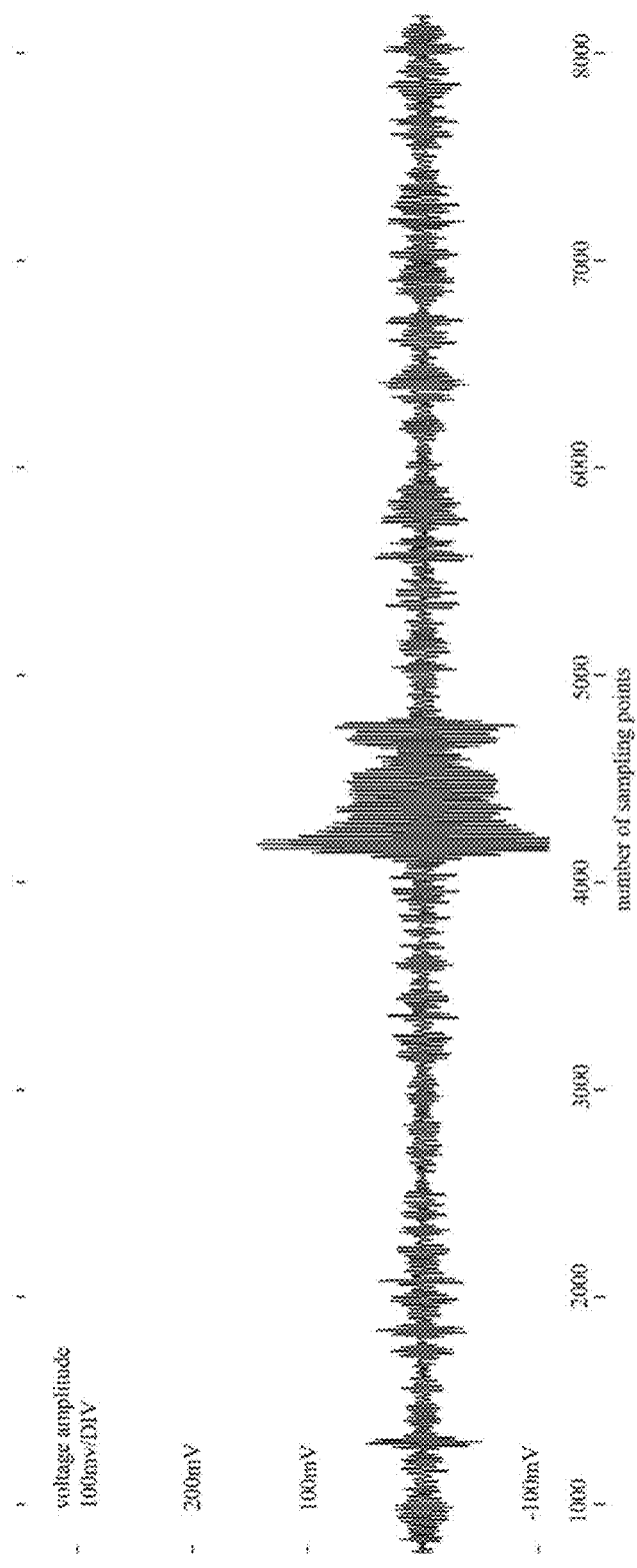
FIG. 4 is a schematic diagram of receiving a signal when a resistivity value of a solution is 0.5 ohm-meter.

The resistivity value of the saltwater solution in the water tank is 0.9 ohm-meter, a transmitted signal is a 1 KHz sinusoidal signal with 32 cycles and an amplitude 2V, and after a signal is transmitted through the emitter of the water tank, a signal obtained after a weak signal of the receiver is amplified by 100,000 times and filtered is as shown in FIG. 4. By means of this ground testing environment, it is possible to verify an amplitude relationship between the transmitted signal and the received signal in a case where the resistivity value of the stratum is 1.6 ohm-meter so as to determine an optimal transmitting power and a receiving gain.

Figure 5:
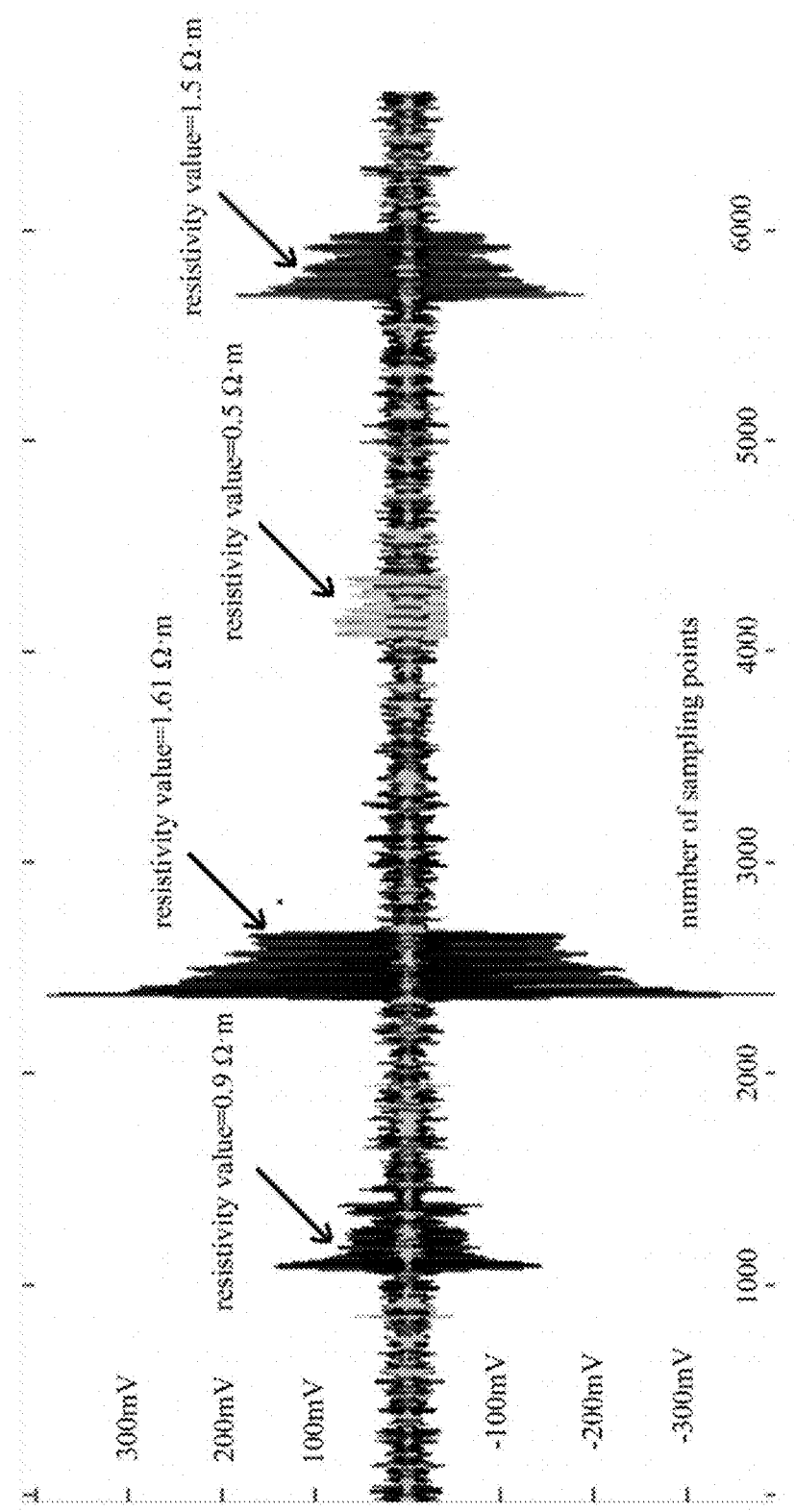
FIG. 5 is a schematic diagram of receiving a signal when resistivity values of solutions are different.

There are four resistivity values of the saltwater solutions in the water tank, ranging from 0.5 ohm-meter to 1.61 ohm-meter, a transmitted signal is a 1 KHz sinusoidal signal with 32 cycles and an amplitude 2V, and after a signal is transmitted through the emitter of the water tank, a weak signal of the receiver is amplified by 100,000 times and filtered to obtain an amplified and filtered received signal, and the amplified and filtered received signals under four environments are compared, as shown in FIG. 5.

By means of the calibration method under the ground testing environment, it is possible to verify an amplitude relationship between the transmitted signal and the received signal in a case where resistivity values of the strata are different so as to determine an optimal transmitting power and a receiving gain.

The invention claimed is:

1. A method for calibrating a near-bit wireless short-transmission system having an emitter and a receiver, comprising:
    placing the emitter and the receiver in a solution, wherein a resistivity value of the solution is adjustable;
    connecting the emitter with the receiver using a metal wire; and
    connecting the emitter to a transmitting circuit;
    connecting the receiver to a receiving circuit;
    transmitting a first signal from the emitter and receiving a second signal at the receiver; and
    calibrating a transmitting power of the first signal and a receiving gain of the second signal by correlating an amplitude relationship between the first signal and the second signal at a plurality of resistivity values of the solution,
    wherein the emitter and the receiver are immersed in the solution.

2. The calibration method according to claim 1, wherein the emitter comprises a transmitting positive pole and a transmitting negative pole separated by a first insulator, the receiver comprises a receiving positive pole and a receiving negative pole separated by a second insulator, and the metal wire connects the transmitting negative pole and the receiving negative pole,
    wherein the transmitting positive pole and the transmitting negative pole are respectively connected to the transmitting circuit through a lead 1 and a lead 2;
    the receiving positive pole and the receiving negative pole are respectively connected to the receiving circuit through a lead 3 and a lead 4, and the receiving circuit measures a potential difference between the lead 3 and the lead 4 to achieve signal reception.

3. The calibration method according to claim 2, wherein a length of each of the leads 1 to 4 is less than 10 cm.

4. The calibration method according to claim 1, wherein a resistivity value of the solution adjustable from 0.2 ohm-meter to 200 ohm-meter.

5. The calibration method according to claim 1, wherein the solution is in a container made of an insulating material, thereby preventing an electric field signal from propagating through a wall of the container.

6. The calibration method according to claim 1, wherein the metal wire is a copper wire.

7. The calibration method according to claim 1, wherein the solution is an aqueous sodium chloride solution, and the resistivity value of the solution is adjusted by changing a concentration of sodium chloride.

8. The calibration method according to claim 1, wherein a diameter of the metal wire is 1 cm or more.

9. The calibration method according to claim 1, wherein the container is made of PVC or glass.

* * * * *